(12) United States Patent
Somervell et al.

(10) Patent No.: US 8,975,009 B2
(45) Date of Patent: Mar. 10, 2015

(54) TRACK PROCESSING TO REMOVE ORGANIC FILMS IN DIRECTED SELF-ASSEMBLY CHEMO-EPITAXY APPLICATIONS

(71) Applicant: Tokyo Electron Limited, Tokyo (JP)

(72) Inventors: Mark H. Somervell, Austin, TX (US); David Hetzer, Schenectady, NY (US); Lior Huli, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/208,160

(22) Filed: Mar. 13, 2014

(65) Prior Publication Data
US 2014/0273472 A1    Sep. 18, 2014

Related U.S. Application Data
(60) Provisional application No. 61/783,490, filed on Mar. 14, 2013.

(51) Int. Cl.
*G03F 7/42* (2006.01)
*H01L 21/311* (2006.01)
(Continued)

(52) U.S. Cl.
CPC ........ *H01L 21/31144* (2013.01); *G03F 7/0002* (2013.01); *G03F 7/42* (2013.01); *G03F 7/422* (2013.01); *G03F 7/425* (2013.01); *B82Y 10/00* (2013.01); *B82Y 40/00* (2013.01)
USPC ....................................................... 430/329

(58) Field of Classification Search
USPC ......................................... 430/322, 323, 329
See application file for complete search history.

(56) References Cited

U.S. PATENT DOCUMENTS
| | | | |
|---|---|---|---|
| 5,344,742 A | 9/1994 | Sinta et al. | |
| 5,650,261 A | 7/1997 | Winkle | |

(Continued)

FOREIGN PATENT DOCUMENTS
| | | |
|---|---|---|
| DE | 102012105384 A1 | 9/2012 |
| KR | 20120133272 A | 12/2012 |

(Continued)

OTHER PUBLICATIONS
Liu et al., "Integration of Block Copolymer Directed Assembly with 193 Immersion Lithography" American Vacuum Society, J. Vac. Sci. Technol. B 28(6), Nov./Dec. 2010, 5 pp.
(Continued)

*Primary Examiner* — Brittany Raymond
(74) *Attorney, Agent, or Firm* — Wood, Herron & Evans, LLP

(57) ABSTRACT

A method is provided for preparing a prepatterned substrate for use in DSA integration. In one example, the method includes removing a radiation-sensitive material pattern overlying a patterned cross-linked polystyrene copolymer layer by a) exposure to a solvent vapor, b) exposure to a liquid solvent, and c) repeating steps a)-b) until the radiation-sensitive material pattern is completely removed. In another example, the method includes removing a neutral layer by affecting removal of an underlying patterned radiation-sensitive material layer, which includes swelling the neutral layer; and removing the radiation-sensitive material pattern and the swollen neutral layer in portions by exposing the swollen layer and pattern to a developer solution. Swelling the neutral layer includes a) exposure to a solvent vapor; b) exposure to a liquid solvent; and c) repeating steps a)-b) until the neutral layer is sufficiently swollen to allow penetration of the developing solution through the swollen neutral layer.

16 Claims, 6 Drawing Sheets

(51) Int. Cl.
*G03F 7/00* (2006.01)
*B82Y 10/00* (2011.01)
*B82Y 40/00* (2011.01)

(56) References Cited

U.S. PATENT DOCUMENTS

| | | | |
|---|---|---|---|
| 6,303,477 | B1 | 10/2001 | Ianovitch |
| 6,855,476 | B2 | 2/2005 | Ferreira et al. |
| 7,521,094 | B1 | 4/2009 | Cheng et al. |
| 7,579,278 | B2 | 8/2009 | Sandhu |
| 7,687,220 | B2 | 3/2010 | Yamato et al. |
| 7,723,009 | B2 | 5/2010 | Sandhu et al. |
| 7,754,518 | B2 | 7/2010 | Koelmel et al. |
| 7,923,373 | B2 | 4/2011 | Sandhu |
| 8,039,196 | B2 | 10/2011 | Kim et al. |
| 8,083,953 | B2 | 12/2011 | Millward et al. |
| 8,241,822 | B2 | 8/2012 | Yamato et al. |
| 8,420,304 | B2 | 4/2013 | Inatomi |
| 8,603,867 | B2 | 12/2013 | Kim et al. |
| 2002/0192619 | A1 | 12/2002 | Besek |
| 2002/0193619 | A1 | 12/2002 | Crivello et al. |
| 2003/0084925 | A1 | 5/2003 | Nakajima et al. |
| 2005/0056219 | A1 | 3/2005 | Dip et al. |
| 2005/0215713 | A1 | 9/2005 | Hessell et al. |
| 2006/0123658 | A1 | 6/2006 | Izumi |
| 2006/0251989 | A1 | 11/2006 | Breyta et al. |
| 2007/0037412 | A1 | 2/2007 | Dip et al. |
| 2007/0237697 | A1 | 10/2007 | Clark |
| 2007/0238028 | A1 | 10/2007 | Inatomi |
| 2008/0318005 | A1 | 12/2008 | Millward |
| 2009/0081827 | A1 | 3/2009 | Yang et al. |
| 2009/0087664 | A1 | 4/2009 | Nealey et al. |
| 2009/0181171 | A1 | 7/2009 | Cheng et al. |
| 2009/0200646 | A1 | 8/2009 | Millward et al. |
| 2009/0236309 | A1 | 9/2009 | Millward et al. |
| 2010/0055621 | A1 | 3/2010 | Hatakeyama et al. |
| 2010/0227276 | A1 | 9/2010 | Mizuno |
| 2011/0033786 | A1 | 2/2011 | Sandhu |
| 2011/0059299 | A1 | 3/2011 | Kim et al. |
| 2011/0147984 | A1 | 6/2011 | Cheng et al. |
| 2011/0147985 | A1 | 6/2011 | Cheng et al. |
| 2011/0229120 | A1 | 9/2011 | Takaki et al. |
| 2011/0272381 | A1 | 11/2011 | Millward et al. |
| 2012/0046415 | A1 | 2/2012 | Millward et al. |
| 2012/0046421 | A1 | 2/2012 | Darling et al. |
| 2012/0077127 | A1 | 3/2012 | Sills et al. |
| 2012/0088192 | A1 | 4/2012 | Trefonas et al. |
| 2013/0189504 | A1 | 7/2013 | Nealey et al. |
| 2014/0061154 | A1 | 3/2014 | Kim et al. |
| 2014/0099583 | A1 | 4/2014 | Holmes et al. |
| 2014/0154630 | A1 | 6/2014 | Schmid et al. |

FOREIGN PATENT DOCUMENTS

| | | |
|---|---|---|
| WO | 03016209 A1 | 2/2003 |
| WO | 2012071330 A1 | 5/2012 |
| WO | 2012084558 A1 | 6/2012 |
| WO | 2012175342 A2 | 12/2012 |
| WO | 2012175343 A1 | 12/2012 |
| WO | 2013010730 A1 | 1/2013 |

OTHER PUBLICATIONS

Bielawski et al., "Regiospecific One-Pot Synthesis of Diaryliodonium Tetrafluoroborates from Arylboronic Acids and Aryl Iodides," J. Org. Chem. 73:4602-4607, 2008.
Cheng et al., "Developing Directly Photodefinable Substrate Guiding Layers for Block Copolymer Directed Self-Assembly (DSA) Patterning," Proc. Of SPIE. 7972:797221(1)-797221(13), 2011.
Cheng et al., "Simple and Versatile Methods to Integrate Directed Self-Assembly with Optical Lithography Using a Polarity-Switched Photoresist," ACS Nano, 4(8):4815-4823, 2010.
Cheng, et al., "EUVL Compatible, LER Solutions using Functional Block Copolymers," Alternative Lithographic Technologies IV, Proc. of SPIE, vol. 8323, 2012, 11 pp.
Cho et al., "Polymer Bound Photobase Generators and Photoacid Generators for Pitch Division Lithography," Proc. of SPIE. 7972:797221(1)-797221(8), 2011.
Cupta, "Photoacid Generators for Catalytic Decomposition of Polycarbonate," Thesis for Master of Science, Georgia Institute of Technology, 2006, 137 pp.
Gronheid, R.; Rincon Delgadillo, P.; Nealey, P.; Younkin, T.; Matsunaga, K.; Somervell, M. and Nafus, K. Implementations of self-assembly in a 300mm processing environment. IEEE Litho Workshop. (Jun. 25-28, 2012; Williamsburg, VA, USA).
Maki et al., "Photocleavable Molecule for Laser Desorption Ionization Mass Spectrometry," J. Org. Chem. 72:6427-6433, 2007.
Padmanaban et al., "Application of Photodecomposable Base Concept to 193 nm Resists," Proc. of SPIE. 3999:1136-1146, 2000.
Ross et al., "Si-containing block copolymers for self-assembled nanolithography," J. Vac. Sci. Technol. B. 26(6):2489-2494, 2008.
Ross et al., "Templated Self-Assembly of Block Copolymer Films," 2012 Materials Research Society (MRS) Fall Meeting & Exhibit, Symposium S: Directed Self-Assembly for Nanopatterning, Nov. 25-30, 2012, Boston, Massachussetts, 64 pp.
Gotrik et al., "Thermosolvent Annealing of Block Copolymer Thin Films for Directed Self-Assembly Applications," 2012 Materials Research Society (MRS) Fall Meeting & Exhibit, Symposium S: Directed Self-Assembly for Nanopatterning, Nov. 25-30, 2012, Boston, Massachussetts, 15 pp.
Ruebner et al., "A cyclodextrin dimer with a photocleavable linker as a possible carrier for the photosensitizer in photodynamic tumor therapy," PNAS. 96(26):14692-14693, 1999.
Skulski, "Organic Iodine(I, III, and V) Chemistry: 10 Years of Development at the Medical University of Warsaw, Poland," Molecules. 5:1331-1371, 2000.
Weissman et al., "Recent advances in ether dealkylation," Tetrahedron. 61:7833-7863, 2005.
Gotrik et al., "Morphology Control in Block Copolymer Films Using Mixed Solvent Vapors," ACS Nano, 6(9):8052-8059, 2012.
Hammersky et al., "Self-Diffusion of a Polystyrene-Polyisoprene Block Copolymer," Journal of Polymer Science: Part B: Polymer Physics. 34:2899-2909, 1996.
Jung et al., "Orientation-Controlled Self-Assembled Nanolithography Using a Polystyrene-Polydimethylsiloxane Block Copolymer," Nano Lett. 7(7):2046-2050, 2007.
Jung et al., "A Path to Ultranarrow Patterns Using Self-Assembled Lithography," Nano Lett. 10:1000-1005, 2010.
Postnikov et al., "Study of resolution limits due to intrinsic bias in chemically amplified photoresists," J. Vac. Sci. Technol. B. 17(6):3335-3338, 1999.
Rathsack et al., "Pattern Scaling with Directed Self Assembly Through Lithography and Etch Process Integrations," Proc. of SPIE 8323, Alternative Lithographic Technologies IV, 83230B (Mar. 1, 2012); doi:10.1117/12.916311, 14 pp.
International Searching Authority, International Search Report and Written Opinion issued in corresponding International Application No. PCT/US13/40815, mailed Oct. 21, 2013, 15 pp.
Choi et al., "Square Arrays of Holes and Dots Patterned from a Linear ABC Triblock Terpolymer," ACS Nano, 6(9):8342-8348, 2012.
Foubert et al., "Impact of post-litho LWR smoothing processes on the post-etch patterning result," Proc. of SPIE, 7972:797213(1)-797213(10), 2011.
Tavakkoli K.G. et al., "Templating Three-Dimensional Self-Assembled Structures in Bilayer Block Copolymer Films," Science, 336:1294-1298, 2012.
Cushen et al., "Oligosaccharide/Silicon-Containing Block Copolymers with 5 nm Features for Lithographic Applications" ACS Nano, vol. 6, No. 4, 2012, pp. 3424-3433.
Dean, et al., "Orientation Control of Silicon-containing Block Copolymer Films," Dept. of Chemical Engineering, The University of Texas at Austin, 1 p.

(56) References Cited

OTHER PUBLICATIONS

Jarnagin, et al., "Investigation of High c Block Copolymers for Directed Self-Assembly: Synthesis and Characterization of PS-b-PHOST," Alternative Lithographic Technologies IV, Proc. of SPIE, vol. 8323, 2012, 9 pp.

Steven J. Lickteig et al., Optimization of an Integrated and Automated Macro Inspection System for the Utilization of Wafer Color Variation Detection in a Photolithography Cluster, Metrology, Inspection, and Process Control for Microlithography, Proc. Of SPIE vol. 6152, 9 pages.

Zhao et al., "Self-reorganization of mixed poly(methyl methacrylate)/polystyrene brushes on planar silica substrates in reponse to combined selective solvent treatments and thermal annealing", Polymer 45 (2004) 7979-7988.

International Searching Authority, Search Report and Written Opinion issued in corresponding International Application No. PCT/US2014/016766 dated May 26, 2014, 11 pages.

International Searching Authority, Search Report and Written Opinion issued in corresponding International Application No. PCT/US2014/016776 dated May 30, 2014, 12 pages.

Vayer et al., "Perpendicular orientation of cylindrical domains upon solvent annealing thin films of polystyrene-b-polylactide", Thin Solid Films 518 (2010) 3710-3715.

Peng et al., "Development of Nanodomain and Fractal Morphologies in Solvent Annealed Block Copolymer Thin Films", Macromolecular Rapid Communications 2007, 28, 1422-1428.

Yu et al., "Self-assembly of polystyrene-poly(4-vinylpyridine) in deoxycholic acid melt", Polymer, Elsevier Science Publishers B.V, GB, vol. 52, No. 18, Jul. 13, 2011, pp. 3994-4000.

International Searching Authority, Search Report and Written Opinion issued in corresponding International Application No. PCT/US2014/026969 dated Jul. 16, 2014, 15 pages.

International Searching Authority, Search Report and Written Opinion issued in corresponding International Application No. PCT/US2014/027016 dated Jul. 23, 2014, 11 pages.

International Searching Authority, Search Report and Written Opinion issued in corresponding International Application No. PCT/US2014/023926 dated Jul. 25, 2014, 10 pages.

International Searching Authority, Search Report and Written Opinion issued in corresponding International Application No. PCT/US2014/016760 dated Nov. 6, 2014, 11 pages.

TRACK PROCESSING TO REMOVE ORGANIC FILMS IN DIRECTED SELF-ASSEMBLY CHEMO-EPITAXY APPLICATIONS

CROSS REFERENCE TO RELATED APPLICATION

Pursuant to 37 C.F.R. §1.78(a)(4), this application claims the benefit of and priority to prior filed Provisional Application No. 61/783,490 filed Mar. 14, 2013, which is expressly incorporated herein by reference.

FIELD OF THE INVENTION

The present invention relates generally to methods of fabricating semiconductor devices and, more specifically, to methods of fabricating semiconductor devices using chemo-epitaxy directed self-assembly processes.

BACKGROUND OF THE INVENTION

Directed self-assembly ("DSA") processes use block copolymers (BCPs) to form lithographic structures, which are formed by the rearrangement of the BCP from a random, unordered state to a structured, ordered state. The morphology of the ordered state is variable and depends on a number of factors, including the relative molecular weight ratios of the block polymers, as well as the surrounding chemical and physical environment. Common morphologies include line-space and cylindrical, although other structures may also be used. For example, other ordered morphologies include spherical, lamellar, bicontinuous gyroid, or miktoarm star microdomains.

Two common methods used to guide self-assembly in BCP thin films are graphical epitaxy (also called "grapho-epitaxy") and chemical epitaxy (also called "chemo-epitaxy"). In the grapho-epitaxy method, self-organization of block copolymers is guided by pre-patterned substrates. Self-aligned lamellar BCPs can form parallel line-space patterns of different domains in topographical trenches and enhance pattern resolution by subdividing the space of topographical patterns. However, defects and line-edge roughness are easily induced in this grapho-epitaxy directed self-assembly scheme. For example, if the sidewalls are neutral, the lamellae tend to orient perpendicular to the sidewalls and will not subdivide the pitch along the desired direction.

In the chemo-epitaxy method, the self-assembly of BCP domains is guided by chemical patterns having pitch dimensions commensurate with the domain size or pitch period ($L_0$) of the self-assembled BCP morphology. The affinity between the chemical patterns and at least one of the types of BCP domains results in the precise placement of the different BCP domains on respective corresponding regions of the chemical patterns, i.e., a pinning region. The affinity for the one type of domain (for example the A domains of an A-B diblock copolymer assembly) dominates the interaction of the other domain(s) (for example the B domains) with the non-patterned regions of the surface, which can be selective or non-selective (i.e., neutral) towards the other type(s) of domains. As a result, the pattern formation in the resulting BCP assembly can directly mirror the underlying chemical pattern (i.e., can be a one-for-one reproduction of the features of the chemical pre-pattern). Moreover, depending on the domain size or pitch period ($L_0$) of the self-assembled BCP morphology and the critical dimension (CD) of the pinning regions and the non-patterned regions, frequency multiplication can be achieved. However, dimension control and line-edge roughness can be negatively affected in chemo-epitaxy DSA methods by topographical variations in the chemical pre-pattern.

Two commonly used methods for forming chemical pre-patterns involve the removal of a photoresist feature during the formation of the chemical guide. If the removal of the photoresist feature is improperly performed, it may introduce topographical variations in the chemical prepattern, which in turn can negatively impact the DSA process. Furthermore, the removal of the photoresist can also change the surface properties of the chemical guide which may also adversely impact the DSA process.

The first commonly used method is known to those skilled in the art as the "Wisconsin Flow" or "LiNe flow". Referring to FIGS. 1A-1G, a layered substrate 100a of the prior art is provided having a substrate 101 sequentially layered with a cross-linked polystyrene layer 102 and a patterned layer of photoresist 103 overlying the cross-linked polystyrene layer 102. The imaged layer of photoresist has photoresist lines 104 and openings 106. An oxygen plasma etch step breaks through the cross-linked polystyrene layer 102 and trims the remaining features to provide fine line features 108 and enlarged openings 110, in layered substrate 100b, as shown in FIG. 1B. The fine line features 108 comprise a photoresist portion 108a atop a cross-linked polystyrene portion 108b. Referring to layered substrates 100c-100e in FIGS. 1C-1E, respectively, following a selective removal of the photoresist portion 108a, a layer of hydroxyl terminated poly(styrene-random-methyl methacrylate) (referred to below as the "brush") 112 is coated over the cross-linked polystyrene portion 108b in planarizing fashion (FIG. 1D), and subsequent baking allows the brush to chemically graft to portions of the substrate 101 that were exposed in the enlarged openings 110. The excess brush material that has planarized the cross-linked polystyrene portions 108b is rinsed off using an appropriate solvent leaving only the portion of the brush that was previously grafted to the substrate, referred to hereafter as remaining neutral layer portions 112. The resulting structure is a nearly planar chemo-epitaxy prepattern. A layer of a block copolymer 116 is applied next (FIG. 1F) and annealed to induce self-assembly to form a lamellar film 118 comprising a first domain 118a and a second 118b (FIG. 1G). One challenging step in the Wisconsin Flow is the removal of the photoresist layer 108a without damaging the underlying polystyrene layer 108b. One method for selectively removing the photoresist portions utilizes a warm, ultrasonic solution of N-methypyrrolidinone (NMP) to strip the resist, but this solution has a number of issues for mainstream manufacturing.

The second commonly used method is known to those skilled in the art as the "IBM Liftoff Flow." Referring to FIGS. 2A-2E, a layered substrate 200a of the prior art is provided having a substrate 201 coated with an under-layer 202 and a patterned layer of photoresist 203 having imaged regions 204 (from imaging 206) and un-imaged regions 205. Where the layer of photoresist 203 is a positive tone photoresist comprising a photoacid generator, imaged regions 204 are rendered soluble to positive tone developing chemistry, such as aqueous tetramethylammonium hydroxide (TMAH), upon performing a post-exposure bake. As shown in FIG. 2B, after a post-exposure bake, followed by a positive tone development process, the openings 207 are shown on substrate 200b, along with the un-imaged regions 205. A flood exposure step followed by a bake step provides resist lines 208 that consist of deprotected photoresist polymer, shown in FIG. 2C. The resist lines 208 of FIG. 2C are subsequently coated with a cross-linked neutral layer 212, as shown in FIG. 2D.

The underlying resist lines 208a of FIG. 2D are then lifted off by exposure to a developer solution, which penetrates the thin cross-linked neutral layer 212, and then dissolves the underlying resist lines 208a. As the resist lines 208a dissolve, the portion of the cross-linked neutral layer 212 attached to the resist lines 208a is essentially lifted off the layered substrate 200d because it has lost its underlying support, i.e., the resist lines 208a, to provide openings 217 between remaining neutral layer portions 216 in the IBM Flow chemo-epitaxy prepattern shown in FIG. 2E. Similar to FIGS. 1F-1G, a layer of a block copolymer may be applied and annealed to induce self-assembly to form a lamellar film (not shown). One challenging step in the IBM Flow is the lift-off step. The lift off processing fluid has traditionally been a TMAH developer, in which the cross-linked neutral layer is not soluble, which raises a defectivity concern.

Therefore, due to the aforementioned limitations, new methods for removing photoresist features in chemo-epitaxy prepatterns are highly desirable.

SUMMARY

The present invention overcomes the foregoing problems and other shortcomings, drawbacks, and challenges of conventional chemo-epitaxy prepattern formation in directed self-assembly applications. While the invention will be described in connection with certain embodiments, it will be understood that the invention is not limited to these embodiments. To the contrary, this invention includes all alternatives, modifications, and equivalents as may be included within the scope of the present invention.

According to an embodiment of the present invention, a method for forming a prepattern is provided. The method comprises providing a substrate with a radiation-sensitive material pattern overlying a patterned cross-linked polystyrene copolymer layer; removing the radiation-sensitive material pattern overlying the patterned cross-linked polystyrene copolymer layer, wherein the step of removing the radiation-sensitive material pattern overlying the patterned cross-linked polystyrene copolymer layer comprises: a) exposing the radiation-sensitive material pattern to a solvent vapor; b) exposing the radiation-sensitive material pattern to a liquid solvent; c) repeating steps a)-b) until the radiation-sensitive material pattern is completely removed.

According to another embodiment of the present invention, a method for forming a prepattern is provided. The method comprises providing a substrate with a neutral layer deposited atop a patterned radiation-sensitive material layer; swelling the neutral layer to form a swollen neutral layer; removing the radiation-sensitive material pattern and the swollen neutral layer in portions where the swollen neutral layer overlies the radiation-sensitive material pattern, by exposing the swollen neutral layer and radiation-sensitive material pattern to a developer solution. According to this embodiment, the step of swelling the neutral layer comprises: a) exposing the neutral layer to a solvent vapor; b) exposing the neutral layer to a liquid solvent; c) repeating steps a)-b) until the neutral layer is sufficiently swollen to allow penetration of the developing solution through the swollen neutral layer.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION OF EMBODIMENTS OF THE INVENTION

Figure 1A:
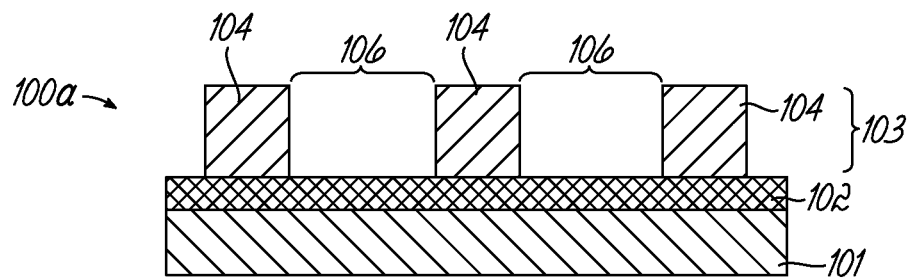
FIGS. 1A-1G illustrate a lithographic process for forming a chemo-epitaxy directed self-assembly (DSA) prepattern, in accordance with an embodiment of the prior art.

A method for preparing a chemo-epitaxy prepatterned substrate for use in direct self-assembly ("DSA") integration is disclosed in various embodiments. However, one skilled in the relevant art will recognize that the various embodiments may be practiced without one or more of the specific details or with other replacement and/or additional methods, materials, or components. In other instances, well-known structures, materials, or operations are not shown or described in detail to avoid obscuring aspects of various embodiments of the present invention.

Similarly, for purposes of explanation, specific numbers, materials, and configurations are set forth in order to provide a thorough understanding. Nevertheless, the embodiments of the present invention may be practiced without specific details. Furthermore, it is understood that the illustrative representations are not necessarily drawn to scale.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment.

Various additional operations may be performed and/or described operations may be omitted in additional embodiments.

In reference to FIGS. 1 and 2, both of these chemo-epitaxy prepattern formation methods involve the removal of an organic film (i.e., a photoresist portion 108a, 208, respectively) that is adjacent and contacting a non-photoresist layer (108b, 212, respectively). However, in order to overcome the problems of the prior art and to minimize topography of the chemo-epitaxy prepattern, the methods described herein utilize new combinations of processing steps employing track-based processing to remove the organic film to prepare a prepatterned substrate for use in DSA applications. These methods can improve the reliability of the annealing step (i.e., the self-assembly of the block copolymer) in the DSA integration, thereby minimizing processing defects. Thus, in accordance with embodiments of the present invention, the removal of the photoresist portion (108a, 208) may be affected without the introduction of substantial defects and topographical variations, as described in further detail below.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a $\chi N$ value, with other polymer blocks of unlike monomer types, that is sufficient for phase separation to occur. $\chi$ is the Flory-Huggins interaction parameter, which is temperature dependent, and N is the total degree of polymerization for the block copolymer. According to embodiments of the present invention, the $\chi N$ value of one polymer block with at least one other polymer block in the larger polymer may be equal to or greater than about 10.5, at the annealing temperature.

As used herein, the term "block copolymer" means and includes a polymer composed of chains where each chain contains two or more polymer blocks as defined above and at least two of the blocks are of sufficient segregation strength (e.g., $\chi N > 10.5$) for those blocks to phase separate. A wide variety of block polymers are contemplated herein including diblock copolymers (i.e., polymers including two polymer blocks (AB)), triblock copolymers (i.e., polymers including three polymer blocks (ABA or ABC)), multiblock copolymers (i.e., polymers including more than three polymer blocks (ABCD, star copolymers, miktoarm polymers, etc.)), and combinations thereof.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The terms "microphase segregation" and "microphase separation," as used herein mean and include the properties by which homogeneous blocks of a block copolymer aggregate mutually, and heterogeneous blocks separate into distinct domains. In the bulk, block copolymers can self assemble into ordered morphologies, having spherical, cylindrical, lamellar, or bicontinuous gyroid microdomains, where the molecular weight of the block copolymer dictates the sizes of the microdomains formed. The domain size or pitch period ($L_O$) of the self-assembled block copolymer morphology may be used as a basis for designing critical dimensions of the patterned structure. Similarly, the structure period ($L_S$), which is the dimension of the feature remaining after selectively etching away one of the polymer blocks of the block copolymer, may be used as a basis for designing critical dimensions of the patterned structure.

The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by various methods known in the art, including, but not limited to: thermal annealing (either in a vacuum or in an inert atmosphere, such as nitrogen or argon), solvent vapor-assisted annealing (either at or above room temperature), or supercritical fluid-assisted annealing. As a specific example, thermal annealing of the block copolymer may be conducted by exposing the block copolymer to an elevated temperature that is above the glass transition temperature (Tg), but below the thermal degradation temperature (Td) of the block copolymer, and also below the order-disorder temperature (ODT) above which the block copolymer will no longer phase separate. Other conventional annealing methods not described herein may also be utilized.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that like blocks aggregate together, thereby forming alternating regions containing each block type or species. For example, if the copolymers are formed of polar (e.g., organometallic-containing polymers) and non-polar blocks (e.g., hydrocarbon polymers), the blocks will segregate so that non-polar blocks aggregate with other non-polar blocks and polar blocks aggregate with other polar blocks. It will be appreciated that the block copolymers may be described as a self-assembling material since the blocks can move to form a pattern without active application of an external force to direct the movement of particular individual molecules, although heat may be applied to increase the rate of movement of the population of molecules as a whole.

In addition to interactions between the polymer block species, the self-assembly of block copolymers can be influenced by topographical features, such as steps or guides extending perpendicularly from the horizontal surface on which the block copolymers are deposited. For example, a diblock copolymer, a copolymer formed of two different polymer block species, may form alternating domains, or regions, which are each formed of a substantially different polymer block species. When self-assembly of polymer block species occurs in the area between the perpendicular walls of a step or guides, the steps or guides may interact with the polymer blocks such that, e.g., each of the alternating regions formed by the blocks is made to form a regularly spaced apart pattern with features oriented generally parallel to the walls and the horizontal surface.

Such self-assembly can be useful in forming masks for patterning features during semiconductor fabrication processes. For example, one of the alternating domains may be removed, thereby leaving the material forming the other region to function as a mask. The mask may be used to pattern features such as electrical devices in an underlying semiconductor substrate. Methods for forming a copolymer mask are disclosed in U.S. Pat. Nos. 7,579,278; and 7,723,009, the entire disclosure of each of which is incorporated by reference herein.

According to an embodiment of the present invention, the directed self-assembly block copolymer is a block copolymer comprising a first polymer block and a second polymer block, where the first polymer block inherently has an etch selectivity greater than 2 over the second block polymer under a first set of etch conditions. According to one embodiment, the first polymer block comprises a first organic polymer, and the second polymer block comprises a second organic polymer. In another embodiment, the first polymer block is an organic polymer and the second polymer block is an organometallic-containing polymer. As used herein, the organometallic-containing polymer includes polymers comprising inorganic materials. For example, inorganic materials include, but are not limited to, metalloids such as silicon, and/or transition metals such as iron.

It will be appreciated that the total size of each block copolymer and the ratio of the constituent blocks and monomers may be chosen to facilitate self-organization and to form organized block domains having desired dimensions and periodicity. For example, it will be appreciated that a block copolymer has an intrinsic polymer length scale, the average end-to-end length of the copolymer in film, including any coiling or kinking, which governs the size of the block domains. A copolymer solution having longer copolymers may be used to form larger domains and a copolymer solution having shorter copolymers may be used to form smaller domains.

Moreover, the types of self-assembled microdomains formed by the block copolymer are readily determined by the volume fraction of the first block component to the second block components.

For example, when the volume ratio of the first block component to the second block component is greater than about 80:20, the block copolymer will form an ordered array of spheres composed of the second polymeric block component in a matrix composed of the first polymeric block component. Conversely, when the volume ratio of the first block component to the second block component is less than about 20:80, the block copolymer will form an ordered array of spheres composed of the first polymeric block component in a matrix composed of the second polymeric block component.

When the volume ratio of the first block component to the second block component is less than about 80:20 but greater than about 65:35, the block copolymer will form an ordered array of cylinders composed of the second polymeric block component in a matrix composed of the first polymeric block component. Conversely, when the volume ratio of the first block component to the second block component is less than about 35:65 but greater than about 20:80, the block copolymer will form an ordered array of cylinders composed of the first polymeric block component in a matrix composed of the second polymeric block component.

When the volume ratio of the first block component to the second block component is less than about 65:35 but is greater than about 35:65, the block copolymer will form alternating lamellae composed of the first and second polymeric block components.

Therefore, the volume ratio of the first block component to the second block component can be readily adjusted in the block copolymer in order to form desired self-assembled periodic patterns. According to embodiments of the present invention, the volume ratio of the first block component to the second block component is less than about 65:35 but greater than about 35:65 to yield an ordered array of lamellar domains composed of alternating layers of the first polymer block component and the second polymeric block component.

Block copolymers may be comprised of exemplary organic polymer blocks that include, but are not limited to, poly(9,9-bis(6'-N,N,N-trimethylammonium)-hexyl)-fluorenephenylene) (PFP), poly(4-vinylpyridine) (4PVP), hydroxypropyl methylcellulose (HPMC), polyethylene glycol (PEG), poly (ethylene oxide)-co-poly(propylene oxide) di- or multiblock copolymers, poly(vinyl alcohol) (PVA), poly(ethylene-co-vinyl alcohol) (PEVA), poly(acrylic acid) (PAA), polylactic acid (PLA), poly(ethyloxazoline), a poly(alkylacrylate), polyacrylamide, a poly(N-alkylacrylamide), a poly(N,N-dialkylacrylamide), poly(propylene glycol) (PPG), poly(propylene oxide) (PPO), partially or fully hydrolyzed poly(vinyl alcohol), dextran, polystyrene (PS), polyethylene (PE), polypropylene (PP), polyisoprene (PI), polychloroprene (CR), a polyvinyl ether (PVE), poly(vinyl acetate) (PVAc), poly(vinyl chloride) (PVC), a polyurethane (PU), a polyacrylate, an oligosaccharide, or a polysaccharide.

Block copolymers may be comprised of exemplary organometallic-containing polymer blocks that include, but are not limited to, silicon-containing polymers such as polydimethylsiloxane (PDMS), polyhedral oligomericsilsesquioxane (POSS), or poly(trimethylsilylstyrene (PTMSS), or silicon- and iron-containing polymers such as poly(ferrocenyldimethylsilane) (PFS).

Exemplary block copolymers include, but are not limited to, diblock copolymers such as polystyrene-b-polydimethylsiloxane (PS-PDMS), poly(2-vinylpyridine)-b-polydimethylsiloxane (P2VP-PDMS), polystyrene-b-poly(ferrocenyldimethylsilane) (PS-PFS), or polystyrene-b-poly-DL-lactic acid (PS-PLA), or triblock copolymers such as polystyrene-b-poly(ferrocenyldimethylsilane)-b-poly(2-vinylpyridine) (PS-PFS-P2VP), polyisoprene-b-polystyrene-b-poly(ferrocenyldimethylsilane) (PI-PS-PFS), or polystyrene-b-poly(trimethylsilylstyrene)-b-polystyrene (PS-PTMSS-PS). In one embodiment, a PS-PTMSS-PS block copolymer comprises a poly(trimethylsilylstyrene) polymer block that is formed of two chains of PTMSS connected by a linker comprising four styrene units. Modifications of the block copolymers is also envisaged, such as that disclosed in U.S. Patent Application Publication No. 2012/0046415, the entire disclosure of which is incorporated by reference herein.

In one particular embodiment, the block copolymer used for forming the self-assembled periodic patterns is a PS-PMMA block copolymer. The polystyrene (PS) and the polymethylmethacrylate (PMMA) blocks in such a PS-PMMA block copolymer can each have a number average molecular weight ranging from about 10 kg/mol to about 100 kg/mol, with a number average molecular weight from about 20 kg/mol to about 50 kg/mole being more typical. Additionally, the volume fraction of the PMMA (fPMMA) can range from about 35% to about 65%. In one embodiment, a PS-PMMA block copolymer having a 44 kg/mol molecular weight, with 50 vol % PMMA, provides lamellar features having an 12.5 nm structure period ($L_S$) and a 25 nm pitch ($L_o$).

Embodiments of the invention may also allow for the formation of features smaller than those that may be formed by block polymers alone or photolithography alone. In embodiments of the invention, a self-assembly material formed of different chemical species is allowed to organize to form domains composed of like chemical species. Portions of those domains are selectively removed to form temporary placeholders and/or mask features. A pitch multiplication process may then be performed using the temporary placeholders and/or mask features formed from the self-assembly material. Features with a pitch smaller than a pitch of the temporary placeholders may be derived from the temporary placeholders.

However, in order to overcome the problems of the prior art and to minimize topography of the chemi-epitaxy prepattern, the method described herein utilizes new combinations of processing steps to prepare a chemo-epitaxy prepatterned substrate for use in DSA applications. This method can improve the reliability of the DSA step, thereby minimizing processing defects.

Thus, in accordance with embodiments of the present, invention, a method for removing an organic film (i.e., a photoresist portion) that is adjacent and contacting a non-photoresist layer as a step in the process of preparing a pre-pattern for DSA integration is provided.

Figure 3:
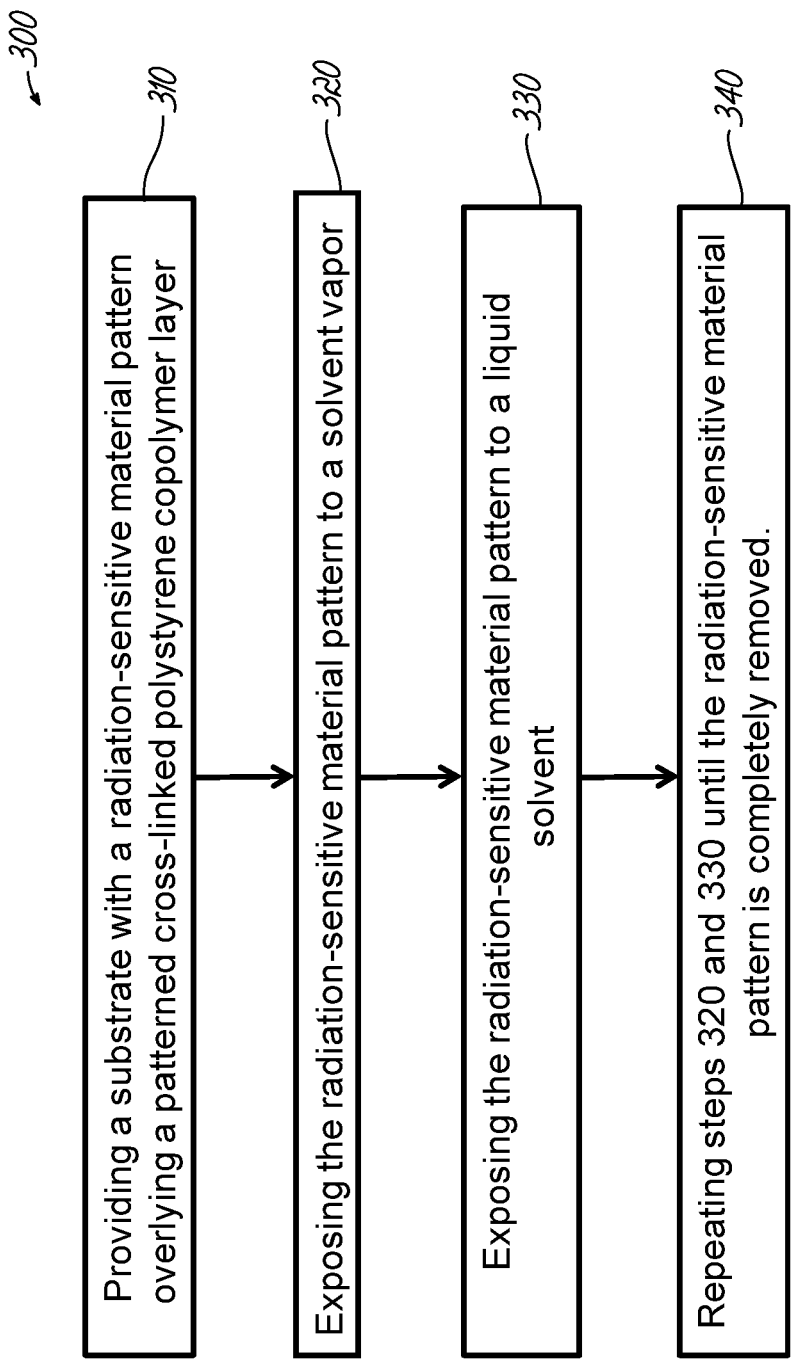
FIG. 3 is a flow chart illustrating a method of forming a DSA prepattern, in accordance with an embodiment of the present invention.

In accordance with an embodiment of the present invention and in reference to FIG. 3, a method (300) for forming a prepattern is provided that comprises providing a substrate with a radiation-sensitive material pattern overlying a patterned cross-linked polystyrene copolymer layer (310); removing the radiation-sensitive material pattern overlying the patterned cross-linked polystyrene copolymer layer, wherein the step of removing the radiation-sensitive material pattern overlying the patterned cross-linked polystyrene copolymer layer comprises: a) exposing the radiation-sensitive material pattern to a solvent vapor (320); b) exposing the radiation-sensitive material pattern to a liquid solvent (330); c) repeating steps a)- b) until the radiation-sensitive material pattern is completely removed (340). It should be appreciated that while method 300 is described herein using a cross-linked polystyrene copolymer, other materials may also be suitable for use as an underlayer to the patterned radiation-sensitive layer. Because the underlayer is ultimately used as a pinning region in the chemo-epitaxy prepattern, the polymer or copolymer may be selected based on its chemical affinity toward one of the polymer blocks of the block copolymer or its chemical neutrality. For example, a cross-linkable PMMA may be used as the underlayer material to pin the PMMA polymer block, as a complementary approach to the described embodiment. In another embodiment, a chemically neutral material may be used as the underlayer, and then a material having a chemical affinity for one of the polymer blocks (e.g., a PS or PMMA brush) may be used (for a PS-b-PMMA BCP).

In accordance with embodiments of the present invention, a "radiation-sensitive material" comprises a material that switches solubility due to a change in polarity upon performing an exposure to radiation of the appropriate wavelength and thereafter performing a first post-exposure bake following the exposure or its equivalent. The radiation-sensitive material may comprise, for example, a 248 nm radiation-sensitive material, a 193 nm radiation-sensitive material, a 157 nm radiation-sensitive material, or an extreme ultraviolet radiation-sensitive material, or a combination of two or more thereof. According to another embodiment, the layer of radiation-sensitive material may comprise a poly(hydroxystyrene)-based resist or a (meth)acrylate-based resist. According to another embodiment, the layer of radiation sensitive material comprises a pinacol-based resist. In any of the foregoing, the removal of the radiation-sensitive material pattern provided after imaging and developing is facilitated by a) exposing the radiation-sensitive pattern to a solvent vapor, and b) exposing the radiation-sensitive material pattern to a liquid solvent treatment, as described in more detail below.

Figure 1B:
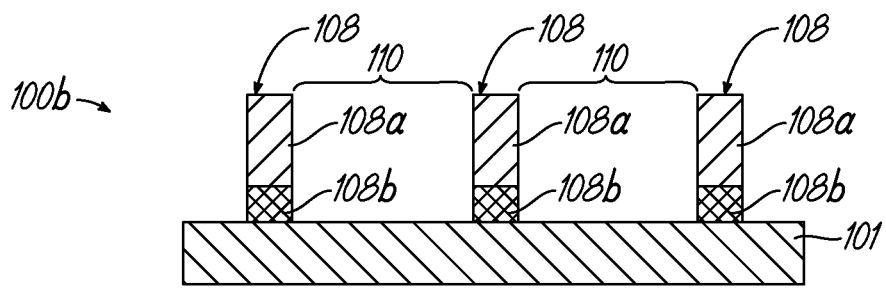
Figure 1C:
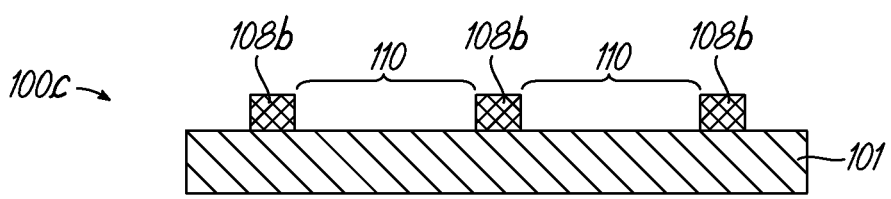
Figure 1D:
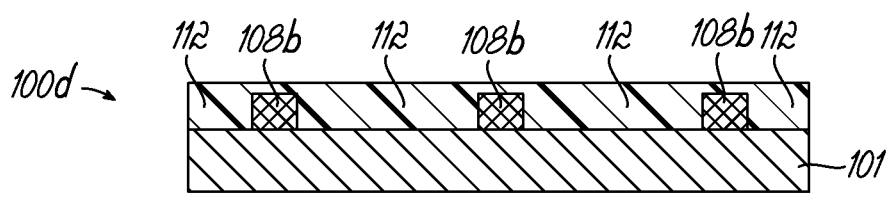
Figure 1E:
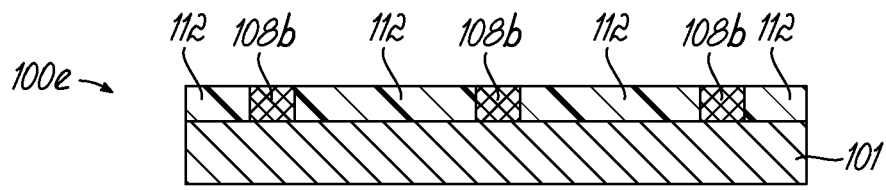
Figure 1F:
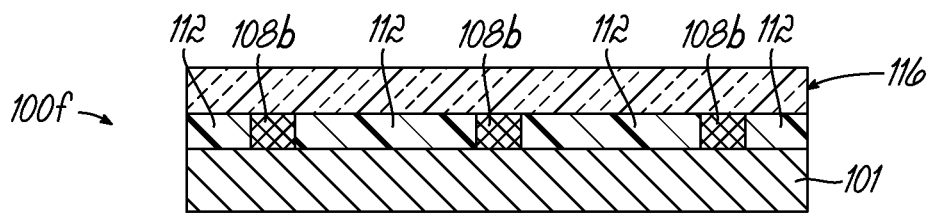
Figure 1G:
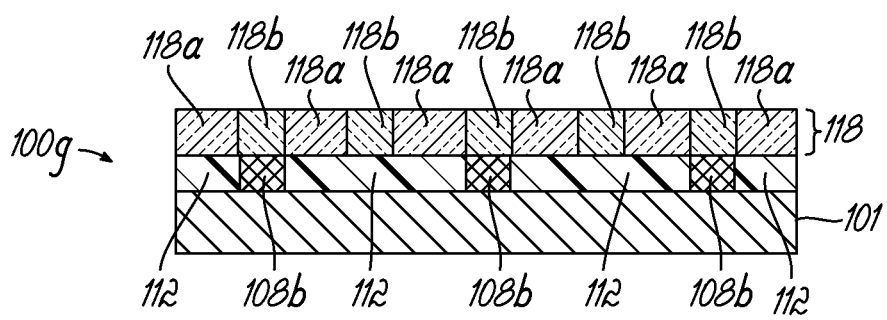

A layered substrate comprising a radiation-sensitive material pattern overlying a patterned cross-linked polystyrene copolymer layer, such as that depicted in FIG. 1B, may be prepared by application of standard methods amenable to conventional track processing systems. For example, the layered substrate may be provided by coating a substrate with a first copolymer layer comprising a polystyrene copolymer; cross-linking the first copolymer layer to form a cross-linked polystyrene copolymer layer; coating the cross-linked polystyrene copolymer layer with a layer of radiation-sensitive material; exposing the layer of radiation-sensitive material to patterned electromagnetic radiation; developing the exposed layer of radiation-sensitive material to form a radiation-sensitive material pattern; etching the cross-linked polystyrene copolymer layer using the radiation-sensitive material pattern as a mask, to form a patterned cross-linked polystyrene copolymer layer; and optionally, laterally trimming the patterned cross-linked polystyrene copolymer layer. One exemplary procedure is described by Liu, C. C. et al. in "Integration of block copolymer directed assembly with 193 immersion lithography" *J. Vac. Sci. Technol. B* 28(6), 2010, pp. C6B30-C6B34.

In accordance with an embodiment of the present invention and in reference to step 320 of FIG. 3, the photoresist section 108a is removed by first injecting a solvent in vapor phase or mist into a processing space surrounding the layered substrate 100b to swell the photoresist section 108a of the radiation-sensitive material pattern, which renders the material more amenable to removal. The next phase introduces a liquid solvent to more thoroughly dissolve the photoresist section 108a. An exemplary photoresist-film processing apparatus is described in U.S. Pat. No. 8,420,304, which is incorporated herein by reference in its entirety.

In one embodiment, the layered substrate 100b, after having been subjected to the developing process, may be transported to a photoresist-film processing apparatus. The layered substrate 100b, which has been transported to the photoresist-film processing apparatus, may be held by a wafer holding part of a chuck that has been already maintained at a predetermined set temperature. At this time, the inside of the resist-film processing apparatus may be purged, for example, with air or nitrogen gas.

After a predetermined time has passed, a temperature of the layered substrate 100b reaches the predetermined set temperature. Then a solvent supply nozzle may be moved to a position to supply the solvent vapor at a constant flow rate to the layered substrate 100b. Optionally, the solvent supply nozzle may be moved at a constant or variable speed across the layered substrate 100b, while the solvent vapor is being continuously jetted from the solvent supply nozzle. Alternatively, the solvent vapor may be pulsed at a constant or variable frequency. Thus, in this manner, the radiation-sensitive material pattern overlying the patterned cross-linked polystyrene copolymer layer may be exposed to the solvent vapor.

Upon exposure of the radiation-sensitive material pattern to the solvent vapor, the solvent vapor is taken into the surface (side surface and upper surface) of the photoresist sections 108a, so that the surface of the photoresist sections 108a begin to dissolve and swell. After exposing the radiation-sensitive material pattern to the solvent vapor for a sufficient time or predetermined time, the supply of the solvent vapor may be discontinued.

In accordance with embodiments of the present invention, the solvent(s) may be selected based on numerous factors, including but not limited to the solubility of the photoresist material in the solvent, the vapor pressure of the solvent, the environmental hazard(s) associated with the solvent, and the like. Exemplary solvents include, but are not limited to, N-methylpyrrolidinone (NMP), dimethyl sulfoxide (DMSO), and dipropylene glycol dimethyl ether (DPGDME), or combinations thereof.

Solvent softening/swelling of the photoresist sections 108a may be performed over a wide temperature range from about room temperature to about 100° C. For example, step 320 may be conducted at about 20° C., about 25° C., about 35° C., about 50° C., about 75° C., or about 100° C., or within a range between any combination of the foregoing.

The partial pressure of the solvent vapor in the treatment space may range from about 1 Torr up to a saturation pressure of the solvent, which is temperature dependent. The remaining gas make-up of the solvent vapor may include a carrier gas, such as nitrogen, or a noble gas such as argon.

The radiation-sensitive material pattern may be exposed to the solvent vapor for a time period sufficient to affect the desired degree of swelling, which may be monitored by optical techniques, or for a predetermined period of time. In one embodiment, the layered substrate 100b may be treated with a solvent vapor for a sufficient period of time to affect a 25% increase in a thickness in the photoresist portion 108a. In another embodiment, the exposure time may range from about 15 seconds to about 10 minutes. For example, the layered substrate 100b may be treated with a solvent vapor for about 30 seconds, about 1 minute, about 2 minutes, about 5 minutes, or about 8 minutes.

The next phase (Step 330 in FIG. 3) is to introduce a liquid solvent to more thoroughly dissolve the photoresist material. Depending on the configuration of the photoresist-film processing apparatus, the solvent vapor-treated substrate may be exposed to a liquid solvent without the need for transferring the layered substrate to a different station. For example, the photoresist-film processing apparatus may be configured with a liquid solvent dispenser in the same operating space. Accordingly, a liquid solvent dispenser may be rotated from a standby position to a supply position, and then supply a predetermined amount of liquid solvent to the layered substrate 100b. The liquid solvent may be applied in a manner such that it spreads all over the layered substrate 100b, so that the whole surface of the layered substrate 100b is covered with a layer of the liquid solvent.

Exemplary solvents for use in this liquid solvent exposure step (330) can be propylene glycol monomethyl ether acetate (PGMEA), cycloexanone, gamma butyrolactone, methyl amyl ketone, ethyl lactate, or blends thereof. Other solvents also suitable for use include those solvents used as negative tone developers, such as n-butyl acetate and methyl isobutyl ketone (MIBK), anisole, and 2-heptanone, or blends thereof. Aqueous tetramethyl ammonium hydroxide (TMAH) solutions ranging from about 0.1 N to about 0.5 N may also be used.

The layer of the liquid solvent may be removed from the layered substrate by displacing with an inert solvent or by spin-drying. The sequence of exposing the radiation-sensitive material pattern to the solvent vapor (320), followed by exposing the radiation-sensitive material pattern to the liquid solvent (330), may be repeated until the photoresist portions 108a are completely removed.

After a predetermined time (time required for the swelling parts of the surface of the photoresist portion 108a to be dissolved) or a predetermined number of repeat sequences of steps 320-330, the layered substrate may be washed with a rinse solvent (such as those commonly used in negative tone development processing) or water (deionized or distilled) to wash away the dissolve portions of the photoresist material and/or displace the bulk of the liquid solvent.

Optionally, when removal of the radiation-sensitive material pattern has been completed, the layered substrate 100c is provided, which may be spin-dried or dried with a nitrogen air knife prior to further processing. If desired, the layered substrate 100c may be transported to a post-baking apparatus to evaporate any residual solvents and/or water remaining on the substrate.

Thus, based on the foregoing process, the photoresist portions 108a were removed from the layered substrate 100b without damaging the underlying cross-linked polystyrene portions 108b to provide layered substrate 100c, which is ready for further processing to prepare a chemo-epitaxy pre-pattern for DSA integration. To that end, the enlarged openings 110 may be filled in by forming a layer of a hydroxyl terminated PS-r-PMMA copolymer brush over and between the cross-linked polystyrene portions 108b, which will serve as pinning regions in a subsequent DSA process, in planarizing fashion. A subsequent baking allows the brush to chemically graft to portions of the substrate 101 that were previously exposed in the enlarged openings 110. The excess brush material that has planarized the cross-linked polystyrene portions 108b is rinsed off using an appropriate solvent leaving only the portion of the brush that was previously grafted to the substrate 101. The resulting structure is a nearly planar chemo-epitaxy prepattern.

Figure 4:
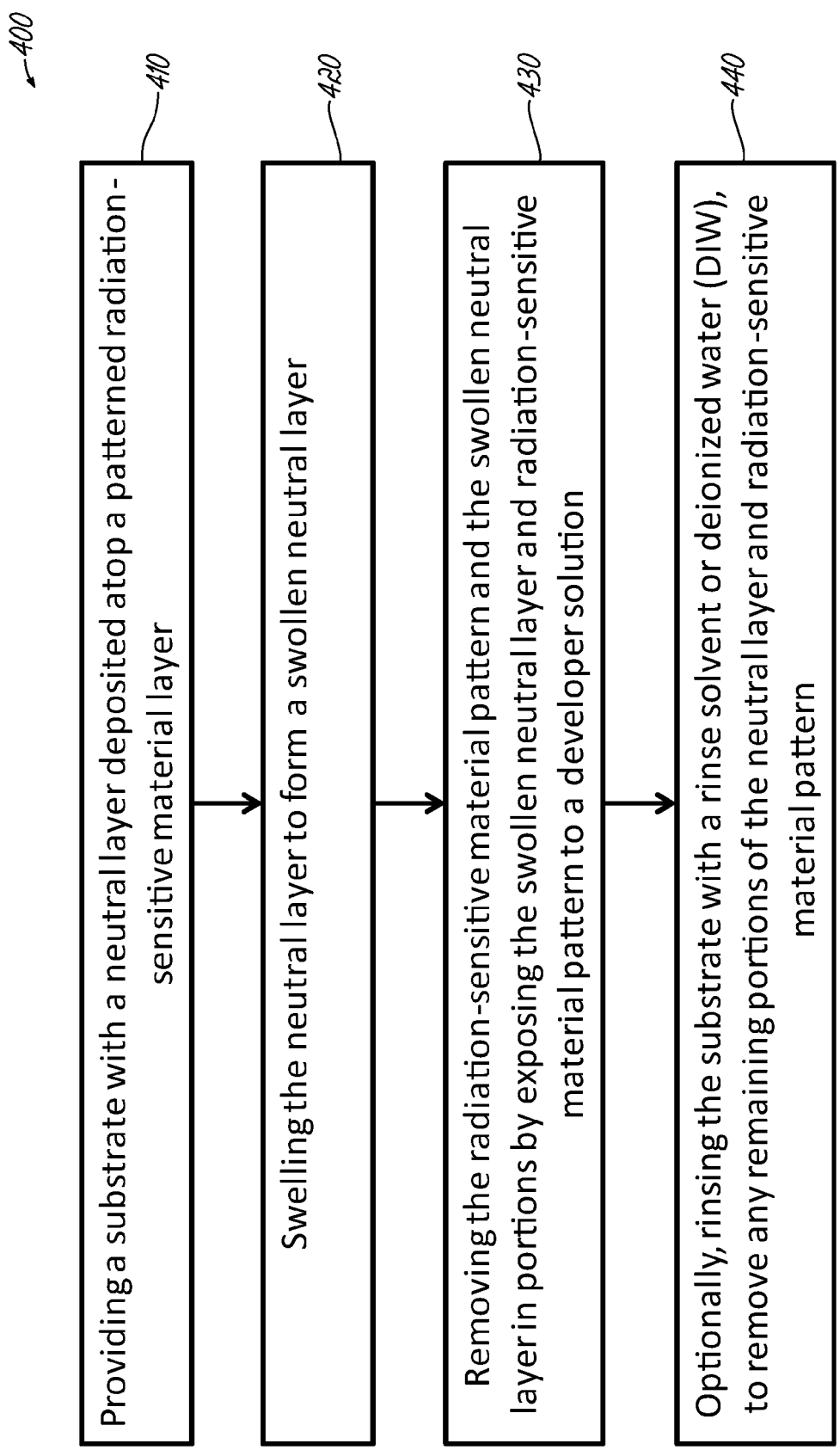
FIG. 4 is a flow chart illustrating a method of forming a DSA prepattern, in accordance with another embodiment of the present invention.
Figure 5:
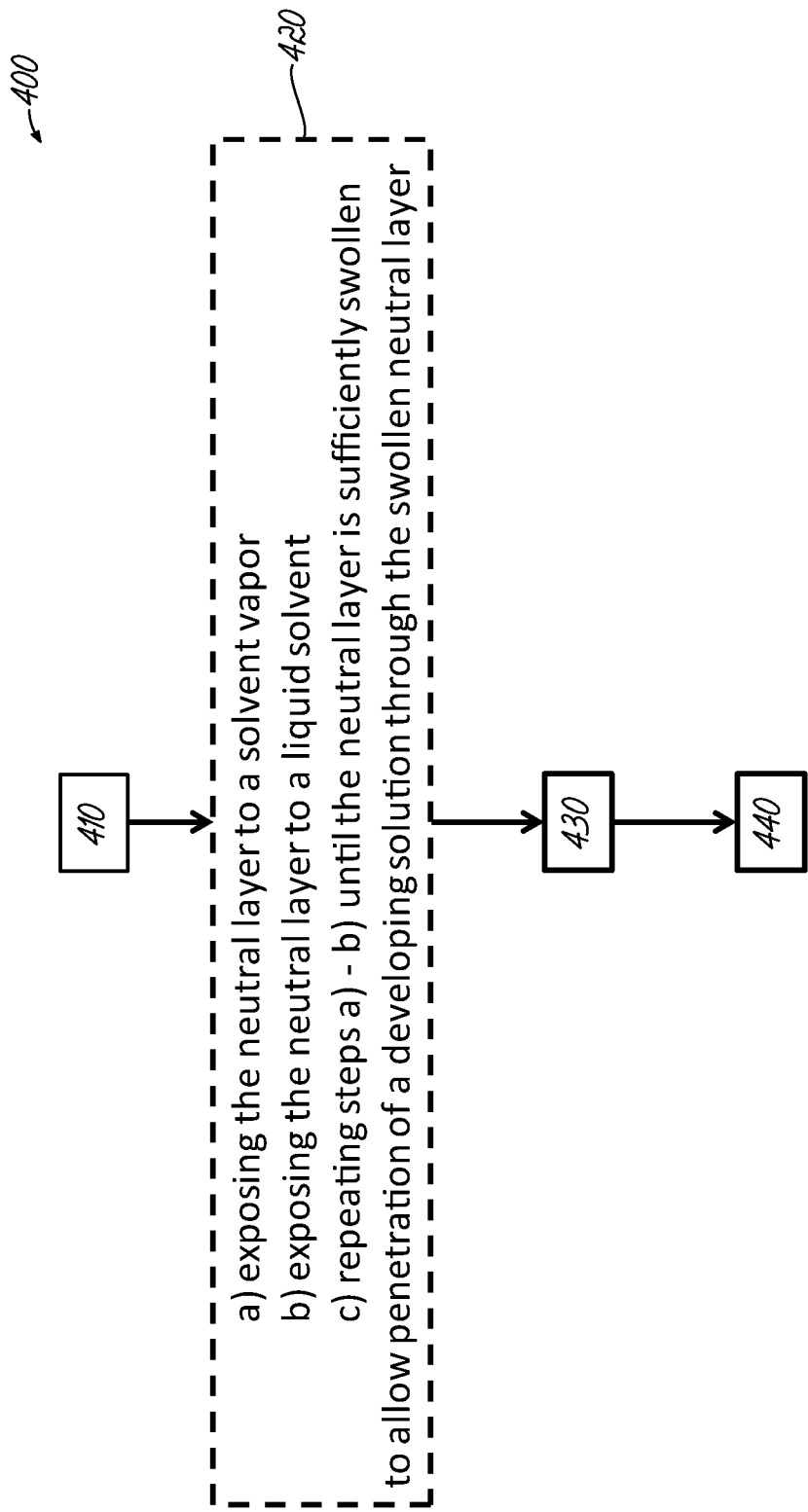
FIG. 5 is a flow chart illustrating the method of forming the DSA prepattern shown in FIG. 4, with additional details for Step 420, in accordance with another embodiment of the present invention.

According to another embodiment of the present invention and in reference to FIG. 4, a method (400) for forming a prepattern is provided. The method comprises providing a substrate with a neutral layer deposited atop a patterned radiation-sensitive material layer (410); swelling the neutral layer to form a swollen neutral layer (420); removing the radiation-sensitive material pattern and the swollen neutral layer in portions where the swollen neutral layer overlies the radiation-sensitive material pattern, by exposing the swollen neutral layer and radiation-sensitive material pattern to a developer solution (430). According to this embodiment and as shown in FIG. 5, the step of swelling the neutral layer (420) comprises: a) exposing the neutral layer to a solvent vapor; b) exposing the neutral layer to a liquid solvent; c) repeating steps a)-b) until the neutral layer is sufficiently swollen to allow penetration of the developing solution through the swollen neutral layer.

Figure 2A:
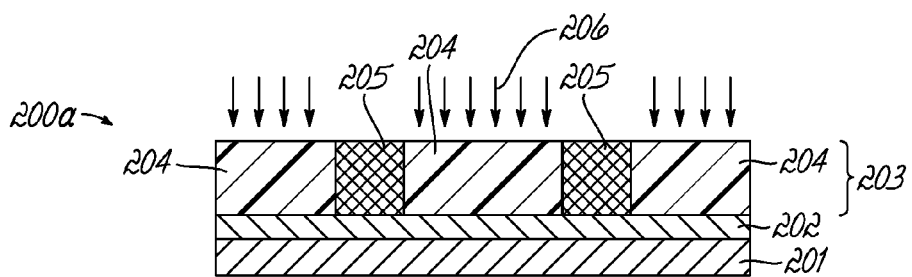
FIGS. 2A-2E illustrate a lithographic process for forming a chemo-epitaxy DSA prepattern, in accordance with an embodiment of the prior art.
Figure 2B:
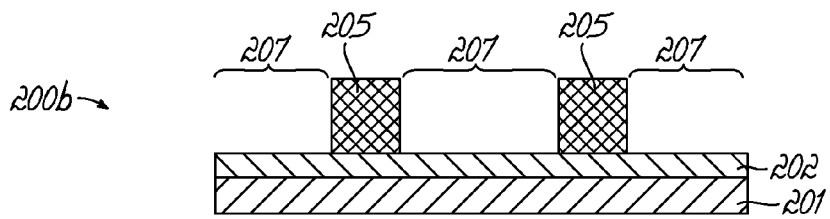
Figure 2C:
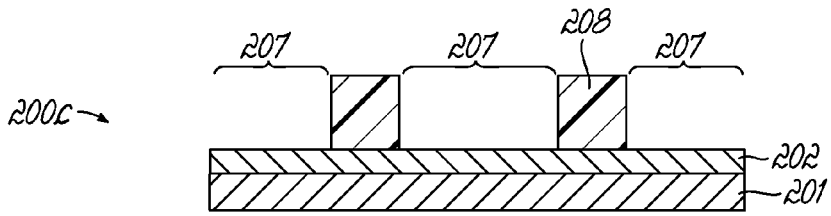
Figure 2D:
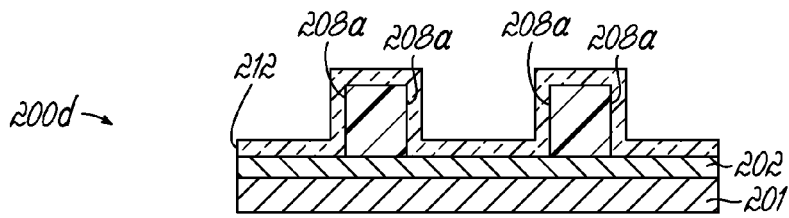

With reference to FIG. 2D, the layered substrate 200d comprising a neutral layer deposited atop a patterned radiation-sensitive material layer serves as an exemplary starting point for implementing method 400 for preparing a chemo-epitaxy prepattern. To that end and in accordance with an embodiment of the present invention, layered substrate 200d comprising a substrate 201 coated with an under-layer 202, such as an silicon-based antireflective coating (Si-ARC). According to this embodiment, the Si-ARC layer 202, once exposed by the lifting off process, serves as a pinning region in the chemo-epitaxy prepattern to the DSA integration process. As described above in reference to FIGS. 2A-2C, a patterned radiation-sensitive material layer is prepared upon the under-layer 202 and then coated with a neutral layer.

As noted above, a "radiation-sensitive material" comprises a material that switches solubility due to a change in polarity upon performing an exposure to radiation of the appropriate wavelength and thereafter performing a first post-exposure bake following the exposure or its equivalent. Exemplary radiation-sensitive materials include a 248 nm radiation-sensitive material, a 193 nm radiation-sensitive material, a 157 nm radiation-sensitive material, or an extreme ultraviolet radiation-sensitive material, or a combination of two or more thereof. According to another embodiment, the layer of radiation-sensitive material may comprise a poly(hydroxystyrene)-based resist or a (meth)acrylate-based resist. According to another embodiment, the layer of radiation sensitive material comprises a pinacol-based resist.

A solution of a radiation-sensitive material (e.g., a photoresist material) can be spin-coated or spray-coated onto the substrate, and then baked to remove the casting solvent to form a photoresist material layer on the layered substrate. Patterning the photoresist material layer with radiation of the appropriately matched wavelength forms a patterned photoresist layer having imaged regions 204 and un-imaged regions 205 on the layered substrate (200a). Depending on the nature of the resist, the subsequent development step can be negative tone, where the un-imaged regions 205 are removed, or positive tone, where the imaged regions 204 are removed. In the embodiment shown in FIG. 2B, a positive tone development has been performed to remove imaged regions 204 and thereby provide openings 207 and un-imaged regions 205. Depending on the chemical composition of the photoresist material comprising the un-imaged regions 205, it is further contemplated that the prepatterned substrate can undergo further processing prior to deposition of the neutral layer. For example, the patterned photoresist layer of the prepatterned substrate can be trimmed. Exemplary methods for trimming, which is also commonly referred to as slimming, are described in U.S. Pat. Ser. Nos. 8,338,086 and 8,435,728, the entire contents of these patent documents are herein incorporated by reference in their entirety.

In accordance with embodiments of the present invention, the un-imaged regions 205, which will be subsequently removed in a lift-off step described in more detail below, may have certain favorable properties. For example, the un-imaged regions 205 may be compatible with the neutral layer deposition process. However, the compatibility of a photoresist material in a neutral layer deposition process is dependent upon the nature of the photoresist material, and the deposition process and its processing conditions. Accordingly, hardening the photoresist pattern subsequent to patterning can render the photoresist pattern resistant to degradation during the subsequent deposition of the neutral layer.

An additional point to consider is that the patterned radiation-sensitive material may be dissolvable in a processing liquid used in the subsequent lift-off process. For example, where the photoresist material is a positive tone photoresist comprising a protected polymer and a photoacid generator, a flood exposure step, followed by a bake step would render the resist lines soluble to aqueous basic solutions, such as tetramethylammonium hydroxide (TMAH) solutions. Thus, as exemplified in the embodiment shown in FIGS. 2B-2C, un-imaged regions 205 comprising a protected photoresist polymer, are converted to resist lines 208, comprising a deprotected photoresist polymer by a flood exposure and a post-exposure bake to provide a prepatterned substrate that is ready for application of a neutral layer, and subsequent dissolution in a processing liquid during the liftoff process.

According to another example, where the photoresist material is a negative tone photoresist developed with organic solvent, the un-imaged regions 205 possess the proper polarity to not be dissolvable in a casting solvent for the subsequent neutral layer coating, and solvable in a processing liquid used in the lift-off process. As such, a flood exposure and a bake step are not necessary.

Thus, in accordance with an embodiment, where the photoresist is a positive tone resist, the layered substrate comprising the patterned positive tone photoresist layer may be exposed to processing conditions prior to deposition of the neutral layer, where the conditions are sufficient to change the polarity of the photoresist material to render it soluble or more soluble to the lift-off processing liquid. Exemplary processes include, but are not limited, exposure and post-exposure bake, acid wash and post-acid wash bake, or heating the photoresist material to a temperature sufficient to induce thermal degradation. In a complementary embodiment, where the photoresist is a negative tone resist, additional processing steps prior to depositing the neutral layer may be omitted.

In accordance with embodiments of the present invention, a neutral layer 212 is deposited atop a patterned radiation-sensitive material layer (Step 410). The method for depositing or applying the neutral layer 212 is not particularly limited, but the chosen method should be amenable to the chemical nature of the layered substrate 200c. It would be further advantageous is the method for forming the neutral layer did not unduly introduce topographical variations to the prepattern. Exemplary methods for applying neutral layers, include a commonly owned patent application filed on of the same date as the instant application entitled "TOPOGRAPHY MINIMIZATION OF NEUTRAL LAYER OVERCOATS IN DIRECTED SELF-ASSEMBLY APPLICATIONS," the entirety of which is incorporated herein by reference in its entirety.

As discussed above, the chemical nature of the neutral layer should be appropriately matched to the block copolymer so as to be chemically neutral to the individual polymer blocks. In one example, where the intended block copolymer for the self-assembly process is a PS-b-PMMA copolymer, exemplary neutral materials include, but are not limited to, a hydroxyl-terminated poly(styrene-r-methyl methacrylate) and various epoxy-functionalized poly(styrene-r-methyl methacrylate) terpolymers, which may be applied by spin-coating and grafted by heating to provide an exemplary substrate, such as that shown in FIG. 2D. One exemplary procedure is described by Cheng, J. Y. et al., "Simple and Versatile Methods To Integrate Directed Self-Assembly with Optical Lithography Using a Polarity-Switched Photoresist" ACS Nano, 4(8), 4815-4823 (2010).

In accordance with embodiments of the present invention and in reference to FIG. 4, the method 400 further includes swelling the neutral layer to form a swollen neutral layer (420). In further reference to FIG. 5, swelling of the neutral layer is affected by a) exposing the neutral layer to a solvent vapor, b) exposing the neutral layer to a liquid solvent, and c) repeating steps a)-b) until the neutral layer is sufficiently swollen to allow penetration of a development solution through the swollen neutral layer. Exposing the swollen neutral layer and radiation-sensitive material pattern to a developer solution removes the radiation-sensitive material pattern and the swollen neutral layer in portions (430). As noted above, the exemplary photoresist-film processing apparatus described in U.S. Pat. No. 8,420,304 may be adapted to perform the lift off process described herein.

Thus, a first phase involves injecting a solvent in vapor phase or mist into a processing space surrounding the layered substrate 200d in FIG. 2D or onto said layered substrate, to swell the neutral layer 212 over the resist lines 208a, which renders the neutral layer relatively more penetrable to the liquid solvent and the developing solution. In one embodiment, the layered substrate 200d may be transported to a processing apparatus and held by a wafer holding part of a chuck that has been already maintained at a predetermined set temperature. At this time, the inside of the processing apparatus may be purged, for example, with air or nitrogen gas.

After a predetermined time has passed, a temperature of the layered substrate 200d reaches the predetermined set temperature. Then a solvent supply nozzle may be moved to a position to supply the solvent vapor at a constant flow rate to the layered substrate 200d. Optionally, the solvent supply nozzle may be moved at a constant or variable speed across the layered substrate 200d, while the solvent vapor is being continuously jetted from the solvent supply nozzle. Alternatively, the solvent vapor may be pulsed at a constant or variable frequency. Thus, in this manner, the neutral layer 212 overlying the resist lines 208 may be exposed to the solvent vapor.

Upon exposure of the neutral layer 212 to the solvent vapor, the solvent vapor is taken into the surface of the neutral layer 212, so that the surface of the neutral layer begins to swell as the solvent molecules penetrate into the neutral layer matrix. After exposing neutral layer 212 to the solvent vapor for a sufficient time or predetermined time, the supply of the solvent vapor may be discontinued.

In accordance with embodiments of the present invention, the solvent(s) may be selected based on numerous factors, including but not limited to the solubility of the neutral layer (or its monomeric components) in the solvent, the vapor pressure of the solvent, the environmental hazard(s) associated with the solvent, and the compatibility (e.g., miscibility) of the solvent and the developer solution. Exemplary solvents include, but are not limited to, N-methylpyrrolidinone (NMP), dimethyl sulfoxide (DMSO), and dipropylene glycol dimethyl ether (DPGDME), or combinations thereof.

Solvent softening/swelling of the neutral layer 212 may be performed over a wide temperature range from about room temperature to about 100° C. For example, step 320 may be conducted at about 20° C., about 25° C., about 35° C., about 50° C., about 75° C., or about 100° C., or within a range between any combination of the foregoing.

The partial pressure of the solvent vapor in the treatment space may range from about 1 Torr up to a saturation pressure of the solvent, which is temperature dependent. The remaining gas make-up of the solvent vapor may include a carrier gas, such as nitrogen, or a noble gas such as argon.

The layered substrate 200d may be exposed to the solvent vapor for a time period sufficient to affect the desired degree of swelling, which may be monitored by optical techniques, or for a predetermined period of time. In one embodiment, the layered substrate 200d may be treated with a solvent vapor for a sufficient period of time to affect a 25% increase in a thickness in the neutral layer 212. In another embodiment, the exposure time may range from about 15 seconds to about 10 minutes. For example, the layered substrate 200d may be treated with a solvent vapor for about 30 seconds, about 1 minute, about 2 minutes, about 5 minutes, or about 8 minutes.

The next phase is to introduce a liquid solvent to more thoroughly impregnated and swell the entire thickness of the neutral layer 212. Depending on the configuration of the processing apparatus, the layered substrate 200d may be exposed to a liquid solvent without any need for transferring the substrate to a different station. For example, the processing apparatus may be configured with a liquid solvent dispenser in the same operating space. Accordingly, a liquid solvent dispenser may be rotated from a standby position to a supply position, and then supply a predetermined amount of liquid solvent to the layered substrate 200d. The liquid solvent may be applied in a manner such that it spreads all over the layered substrate 200d, so that the whole surface of the layered substrate 200d is covered with a layer of the liquid solvent.

Exemplary solvents for use in this liquid solvent exposure step (330) can be propylene glycol monomethyl ether acetate (PGMEA), cycloexanone, gamma butyrolactone, methyl amyl ketone, ethyl lactate, or blends thereof. Other solvents also suitable for use include those solvents used as negative tone developers, such as n-butyl acetate and methyl isobutyl ketone (MIBK), anisole, and 2-heptanone, or blends thereof. Additionally, other solvents used in wet cleaning, such as DMSO, NMP, etc., may also be used.

The layer of the liquid solvent may be removed from the layered substrate by displacing with an inert solvent or by spin-drying. The sequence of exposing the neutral layer to the solvent vapor, followed by exposing the neutral layer to the liquid solvent may be repeated until the neutral layer has reached a desired or a maximum degree of swelling. It should be further appreciated that the order of the solvent vapor/liquid solvent treatments may be reversed and/or performed any number of time using one or more different solvents. After a predetermined time (e.g., experimentally determined time required for attaining the desired or the maximum degree of swelling) or a predetermined number of repeat sequences of solvent vapor/liquid solvent exposures, the layered substrate 200d may be washed with developer solution.

Exemplary developer solutions may be TMAH-based, such as the developers disclosed in U.S. Pat. No. 8,603,867, which is incorporated herein by reference in its entirety. For example, compositions suitable for removing the photoresist lines 208 underlying the swollen neutral layer 212, include but are not limited to a composition comprising about 1 wt % to about 10 wt % of TMAH; about 1 wt % to about 10 wt % of an alkanol amine; about 50 wt % to about 70 wt % of a glycol ether compound; about 0.01 wt % to about 1 wt % of a triazole compound; about 20 wt % to about 40 wt % of a polar solvent, and water, wherein each wt % is based on the total weight of the composition.

After the patterned radiation-sensitive material layer and its overlying swollen neutral layer have been removed, a rinse solvent or water (deionized or distilled) may be applied to the substrate to wash away the dissolve portions of the photoresist material and the pieces of the lifted-off neutral layer, as well as displace the bulk quantity of any remaining developer solution. The rinsing step may be facilitated by application of technology associate with an advance development rinse (ADR) nozzle (Tokyo Electron), which sprays a jet of gas (e.g., air or nitrogen) into a puddle of rinse liquid to create a three phase contact line that is then used to push defects off the wafer. Alternatively, the rinse step may be facilitated by application of technology associated with immersion rinse units (Tokyo Electron). The ADR technology is described in U.S. Patent Application Publication No. 2006/0123658, and the immersion rinse technology is described in U.S. Patent Application Publication No. 2011/0229120, the entire disclosure of these patent documents are incorporated herein by reference in their entirety.

Figure 2E:
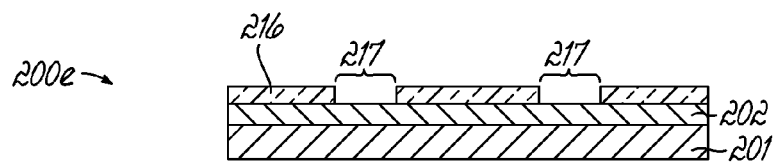

Optionally, when the neutral layer and its underlying patterned radiation-sensitive material layer have been removed, the layered substrate 200e shown in FIG. 2E may be provided, which may be spin-dried or dried with a nitrogen air knife prior to further processing. If desired, the layered substrate 200e may be transported to a post-baking apparatus to evaporate any residual solvents and/or water remaining on the substrate.

Thus, based on the foregoing process, the resist lines 208a and its overlying section of neutral layer 212 may be effectively removed from the layered substrate 200d without substantially damaging the remaining neutral layer portions 216 or the under-layer 202 exposed by openings 217. Accordingly, the layered substrate 200e shown in FIG. 2E is ready for further processing to prepare a chemo-epitaxy prepattern for DSA integration.

The DSA material comprising a BCP may be deposited by various methods, including, e.g., spin-on coating, spin casting, brush coating or vapor deposition. For example, the block copolymer may be provided as a solution in a carrier solvent such as an organic solvent, e.g., toluene, and the carrier solvent subsequently removed.

While the invention is not bound by theory, it will be appreciated that the different block species are understood to self-aggregate due to thermodynamic considerations in a process similar to the phase separation of materials. The self-organization is guided by the pinning regions 108b or 217 in FIG. 1E or 2E, respectively. As generally described above, one of the blocks of the BCP may have a chemical affinity for the pinning regions, which thereby induces one of the domains of the self-assembled BCP to be pinned to pinning regions 108b or 217. Although not shown, the critical dimension of the pinning regions 108b or 217, as well as the critical dimension of the remaining neutral layer portions 112, 216, respectively are important for proper alignment of the self-assembled BCP, as well as pitch multiplication.

The film of the block copolymer is exposed to annealing (baking) conditions to facilitate the self-assembly of the block copolymer. After completion of the annealing step of the film of block copolymer, a layer of self-assembled block polymer having distinct domains is formed. It will be appreciated that one of the domains may be selectively removed in a single step using a single etch chemistry or may be removed using multiple etches with different etch chemistries to provide a pattern defined by the remaining domain. For example, where a self-assembled block copolymer is polystyrene (PS)-b-polymethylmethacrylate (PMMA), the PMMA domains may be removed by performing a selective oxygen plasma etch, leaving behind a patterned substrate with PS lines. The final DSA-derived pattern may be transferred to the underlying substrate. The pattern transfer may be accomplished using etch chemistries appropriate for selectively etching the material or materials of the substrate relative to the remaining unetched domain features.

It will be appreciated that various modifications of the illustrated embodiments are possible. For example, while discussed in the context of diblock copolymers for ease of illustration and discussion, the copolymers may be formed of two or more block species. In addition, while the block species of the illustrated embodiment are each formed of a different monomer, the block species may share monomer(s). For example, the block species may be formed of different sets of monomers, some of which are the same, or may be formed of the same monomer, but in a different distribution in each block. The different sets of monomers form blocks having different properties which may drive the self-assembly of the copolymers.

In addition, while the illustrated embodiments may be applied to fabricate integrated circuits, embodiments of the invention may be applied in various other applications where the formation of patterns with very small features is desired. For example, embodiments of the invention may be applied to form gratings, disk drives, storage media or templates or masks for other lithography techniques, including X-ray or imprint lithography. For example, phase shift photomasks may be formed by patterning a substrate that has a film stack having phase shifting material coatings.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method for forming a prepattern, comprising:
providing a substrate with a radiation-sensitive material pattern overlying a patterned cross-linked polystyrene copolymer layer; and
removing the radiation-sensitive material pattern overlying the patterned cross-linked polystyrene copolymer layer,
wherein the step of removing the radiation-sensitive material pattern overlying the patterned cross-linked polystyrene copolymer layer comprises:
a) exposing the radiation-sensitive material pattern to a solvent vapor;
b) exposing the radiation-sensitive material pattern to a liquid solvent;
c) repeating steps a)-b) until the radiation-sensitive material pattern is completely removed.

2. The method of claim 1, wherein the solvent vapor comprises a solvent selected from the group consisting of n-methylpyrrolidone (NMP), dimethyl sulfoxide (DMSO), and dipropylene glycol dimethyl ether (DPGME), or a mixture of two or more thereof.

3. The method of claim 1, wherein the step of exposing the radiation-sensitive material pattern to a solvent vapor is performed at a temperature in the range from 20° C. to 100° C.

4. The method of claim 1, wherein the step of exposing the radiation-sensitive material pattern to a solvent vapor is performed at a pressure in the range from 1 Torr to a saturation pressure of the solvent vapor.

5. The method of claim 1, wherein liquid solvent comprises a solvent selected from the group consisting of propylene glycol monomethyl ether acetate (PGMEA), cyclohexanone, gamma butyrolactone, methyl amyl ketone, ethyl lactate, n-butyl acetate, methyl isobutyl ketone (MIBK), anisole, 2-heptanone, and an aqueous solution of tetra-methyl ammonium hydroxide (TMAH), or a mixture of two or more thereof.

6. The method of claim 1, further comprising:
rinsing the substrate with a rinse solvent or deionized water (DIW).

7. The method of claim 6, further comprising:
drying the substrate by spinning the substrate or by exposing the substrate to a flow of drying gas, or both.

8. The method of claim 1, further comprising:
coating the substrate with a first copolymer layer comprising a polystyrene copolymer;
cross-linking the first copolymer layer to form a cross-linked polystyrene copolymer layer;
coating the cross-linked polystyrene copolymer layer with a layer of radiation-sensitive material;

exposing the layer of radiation-sensitive material to patterned electromagnetic radiation;
developing the exposed layer of radiation-sensitive material to form a radiation-sensitive material pattern;
etching the cross-linked polystyrene copolymer layer using the radiation-sensitive material pattern as a mask, to form a patterned cross-linked polystyrene copolymer layer; and
optionally laterally trimming the patterned cross-linked polystyrene copolymer layer.

9. A method for forming a prepattern, comprising:
providing a substrate with a neutral layer deposited atop a patterned radiation-sensitive material layer;
swelling the neutral layer to form a swollen neutral layer;
removing the radiation-sensitive material pattern and the swollen neutral layer in portions where the swollen neutral layer overlies the radiation-sensitive material pattern, by exposing the swollen neutral layer and radiation-sensitive material pattern to a developer solution,
wherein the step of swelling the neutral layer comprises:
 a) exposing the neutral layer to a solvent vapor;
 b) exposing the neutral layer to a liquid solvent;
 c) repeating steps a)-b) until the neutral layer is sufficiently swollen to allow penetration of the developing solution through the swollen neutral layer.

10. The method of claim 9, wherein the liquid solvent comprises a solvent selected from the group consisted of propylene glycol monomethyl ether acetate (PGMEA), cyclohexanone, gamma butyrolactone, methyl amyl ketone, ethyl lactate, n-butyl acetate, methyl isobutyl ketone (MIBK), anisole, 2-heptanone, dimethyl sulfoxide (DMSO), or a mixture of two or more thereof.

11. The method of claim 9, wherein the solvent vapor comprises a solvent selected from the group consisting of n-methylpyrrolidone (NMP), dimethyl sulfoxide (DMSO), and dipropylene glycol dimethyl ether, or a mixture of two or more thereof.

12. The method of claim 9, wherein the step of swelling the neutral layer is performed at a temperature in the range from 20° C. to 100° C.

13. The method of claim 9, wherein the step of swelling the neutral layer is performed at a pressure in the range from 1 Torr to a saturation pressure of the solvent vapor.

14. The method of claim 9, further comprising:
rinsing the substrate with a rinse solvent or deionized water (DIW), to remove any remaining portions of the neutral layer and radiation-sensitive material pattern.

15. The method of claim 14, further comprising:
drying the substrate by spinning the substrate or by exposing the substrate to a flow of drying gas, or both.

16. The method of claim 9, further comprising:
coating the substrate with radiation-sensitive material to form a radiation-sensitive material layer;
patterning the radiation-sensitive material layer to form a radiation-sensitive material pattern and exposed portions of the substrate; and
depositing a neutral layer over the radiation-sensitive material pattern and the exposed portions of the substrate.

* * * * *